(12) United States Patent
Hsu et al.

(10) Patent No.: US 9,356,235 B2
(45) Date of Patent: May 31, 2016

(54) STRUCTURE AND FORMATION METHOD OF MEMORY DEVICE

(71) Applicant: Winbond Electronics Corp., Taichung (TW)

(72) Inventors: Po-Yen Hsu, New Taipei (TW); Hsiu-Han Liao, Hsinchu (TW); Shuo-Che Chang, Taichung (TW); Chia Hua Ho, Hsinchu (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 14/474,931

(22) Filed: Sep. 2, 2014

(65) Prior Publication Data

US 2015/0280119 A1   Oct. 1, 2015

(30) Foreign Application Priority Data

Mar. 25, 2014 (TW) .............. 103110984 A

(51) Int. Cl.
*H01L 45/00* (2006.01)
(52) U.S. Cl.
CPC ............. *H01L 45/146* (2013.01); *H01L 45/06* (2013.01); *H01L 45/08* (2013.01); *H01L 45/1233* (2013.01); *H01L 45/1616* (2013.01); *H01L 45/1641* (2013.01)
(58) Field of Classification Search
CPC ....... H01L 45/00; H01L 45/146; H01L 45/08; H01L 27/24; H01L 45/1233; H01L 45/1616; H01L 45/1641; H01L 29/02; H01L 27/04; H01L 45/1266; H01L 45/145
USPC ............. 257/2, 597, 4, 5, 154, 169, 264, 350, 257/364, 536, 537
See application file for complete search history.

(56) References Cited

U.S. PATENT DOCUMENTS

| 8,288,297 B1 | 10/2012 | Wang et al. |
| 2007/0285965 A1* | 12/2007 | Toda et al. ............ 365/148 |
| 2011/0227031 A1* | 9/2011 | Li et al. ............... 257/5 |
| 2012/0001141 A1 | 1/2012 | Hsieh et al. |

FOREIGN PATENT DOCUMENTS

| JP | 2007-180202 | 7/2007 |
| JP | 2008-306004 A | 12/2008 |
| JP | 2011-527834 | 11/2011 |
| JP | 2012-69609 | 4/2012 |
| WO | WO 2013/152088 A1 | 10/2013 |

OTHER PUBLICATIONS

JP Office Action dated Dec. 15, 2015 from corresponding JP Appl No. 2014-147143.

* cited by examiner

*Primary Examiner* — Chuong A Luu
(74) *Attorney, Agent, or Firm* — Muncy, Geissler, Olds & Lowe, P.C.

(57) ABSTRACT

Structures and formation methods of memory devices are provided. The memory device includes a first electrode, a second electrode, and a resistive layer positioned between the first electrode and the second electrode. The resistive layer has a crystalline portion. A volume ratio of the crystalline portion to the resistive layer is in a range from about 0.2 to about 1.

14 Claims, 5 Drawing Sheets

STRUCTURE AND FORMATION METHOD OF MEMORY DEVICE

CROSS REFERENCE TO RELATED APPLICATIONS

This Application claims priority of Taiwan Patent Application No. 103110984, filed on Mar. 25, 2014, the entirety of which is incorporated by reference herein.

BACKGROUND

1. Field of the Disclosure

The disclosure relates to structures and formation methods of memory devices, and in particular to structures and formation methods of resistive random-access memory (RRAM) devices.

2. Description of the Related Art

Recently, a variety of electronic products have become popular, which largely increases the demands for non-volatile memory devices. The flash memory device is the mainstream of the non-volatile memory technology. However, since device sizes continue to shrink, the flash memory device has encountered issues such as high operation voltage, slow operation speed, and bad data retention. As a result, the future development of the flash memory device is limited.

Therefore, many materials and apparatus of new non-volatile memory devices are under development. The new non-volatile memory devices include, for example, magnetic random access memory (MRAM) devices, phase change memory (PCM) devices, and resistive random access memory (RRAM) devices. Among the non-volatile memory devices, the RRAM devices have many advantages such as low power consumption, low operation voltage, short writing-in and erasing time, high reliability, long retention time, non-destructive read-out, multi-state memory, process simplicity, and requiring only a small area.

However, the yield and the operation of the RRAM devices still need to be further improved.

BRIEF SUMMARY OF THE DISCLOSURE

In accordance with some embodiments, a memory device is provided. The memory device includes a first electrode, a second electrode, and a resistive layer positioned between the first electrode and the second electrode. The resistive layer has a crystalline portion. A volume ratio of the crystalline portion to the resistive layer is in a range from about 0.2 to about 1.

In accordance with some embodiments, a method for forming a memory device is provided. The method includes forming a resistive layer over a first electrode. The resistive layer has a crystalline portion, and a volume ratio of the crystalline portion to the resistive layer is in a range from about 0.2 to about 1. The method also includes forming a second electrode over the resistive layer.

In accordance with some embodiments, a memory device is provided. The memory device includes a first electrode, a second electrode, and a resistive layer positioned between the first electrode and the second electrode. The resistive layer has a crystalline portion. An area ratio of the crystalline portion to the resistive layer is in a range from about 0.2 to about 1.

A detailed description is given in the following embodiments with reference to the accompanying drawings.

BRIEF DESCRIPTION OF THE DRAWINGS

The present disclosure can be more fully understood by reading the subsequent detailed description and examples with references made to the accompanying drawings.

DETAILED DESCRIPTION OF THE DISCLOSURE

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows include embodiments in which the first and second features are formed in direct contact, and may also include embodiments in which additional features may be formed between the first and second features, such that the first and second features may not be in direct contact.

Some variations of the embodiments are described. Throughout the various views and illustrative embodiments, like reference numbers are used to designate like elements.

Figure 1A:
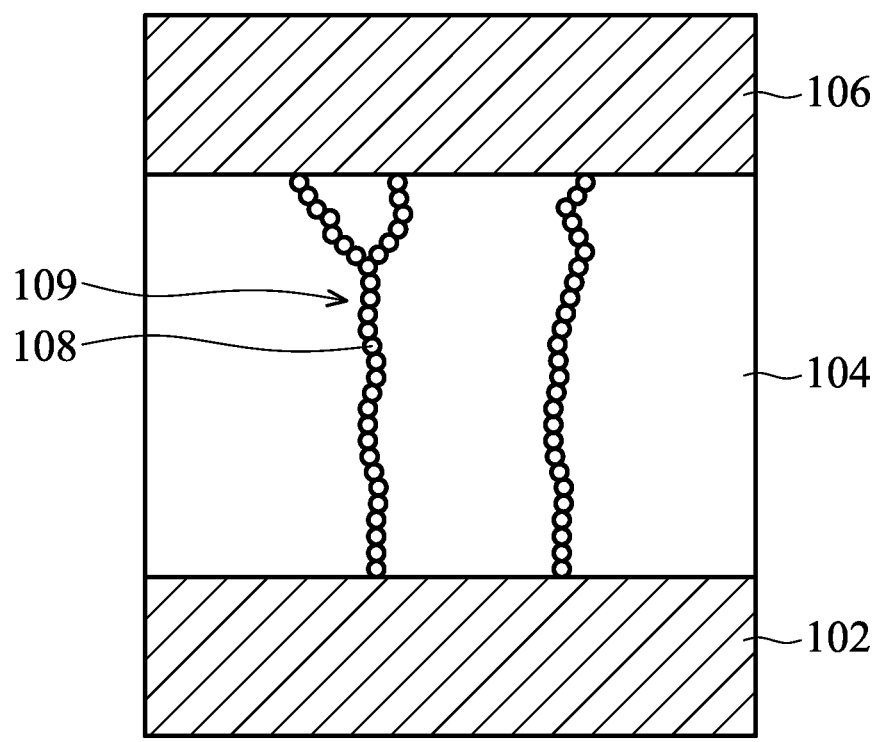
FIG. 1A is a cross-sectional view of a memory device, in accordance with some embodiments.
Figure 1B:
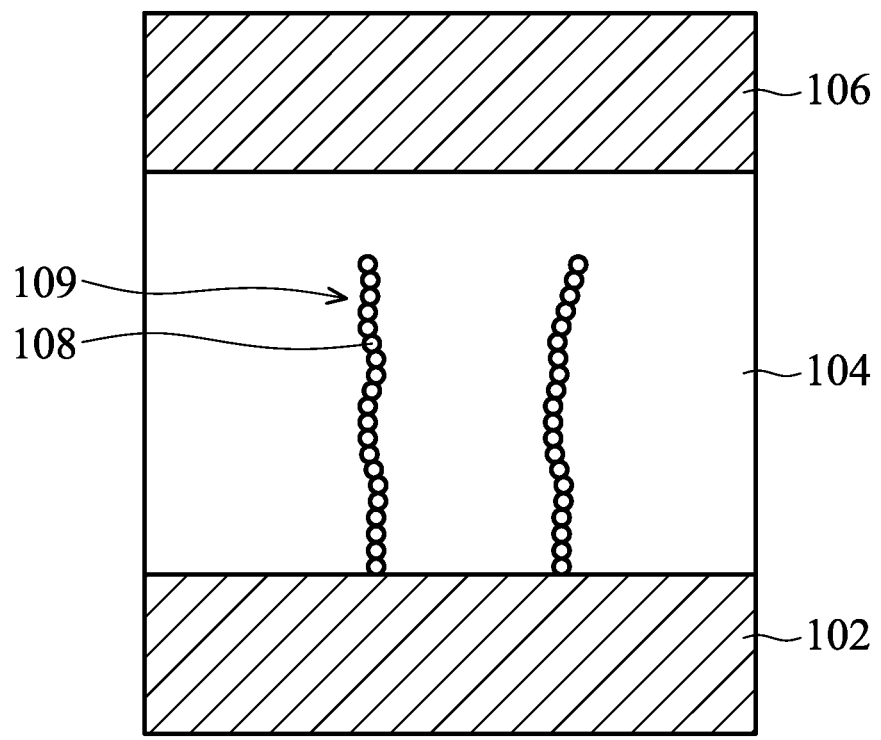
FIG. 1B is a cross-sectional view of a memory device, in accordance with some embodiments.

In accordance with some embodiments, FIGS. 1A and 1B are cross-sectional views of a memory device 100 at a low resistance status and a high resistance status, respectively. In some embodiments, the memory device 100 is a resistive random access memory (RRAM) device. As shown in FIG. 1A, the memory device 100 includes an electrode 102, an electrode 106, and a resistive layer 104 between the electrodes.

In some embodiments, the resistive layer 104 is made of a dielectric material and is usually electrically insulating. However, the resistive layer 104 may become electrically conductive after being applied with a sufficiently high voltage. For example, through a forming process, conductive filaments or conductive paths may be formed in the resistive layer 104. When the conductive filaments or the conductive paths extend towards the electrodes and connect the electrode 102 and the electrode 106, the resistance of the resistive layer 104 may be significantly reduced. Afterwards, a reverse voltage may be applied to partially destroy the formed conductive filaments or the conductive paths, such that the resistance of the resistive layer 104 is increased.

Figure 2:
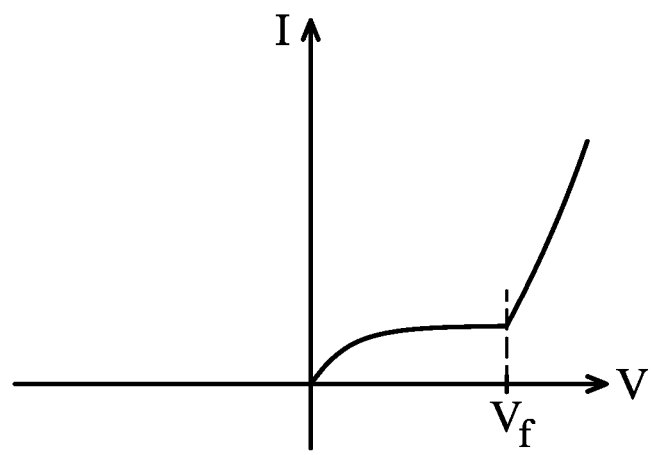
FIG. 2 is an I-V curve obtained from a memory device, in accordance with some embodiments.

FIG. 2 is an I-V curve obtained from a memory device, in accordance with some embodiments. In some embodiments, a forming process is performed to the memory device 100. For example, as shown in FIGS. 2 and 1A, a gradually increasing voltage is applied across the electrode 102 and the electrode 106. The voltage may induce negatively charged ions (such as oxygen ions and/or nitrogen ions) in the resistive layer 104 to move to the electrodes such that a series of vacancies 108 (such as oxygen vacancies and/or nitrogen vacancies) are formed in the resistive layer 104. When the voltage is increased to the level of a forming voltage $V_f$, these vacancies 108 may be connected to become a conductive filament 109 connecting the electrodes 102 and 106 so as to form a conductive path. As a result, the current passing through the resistive layer 104 may be significantly increased.

As shown in FIG. 1B, in some embodiments, a reverse voltage is applied across the electrode 106 and the electrode 102 to reset the resistive layer 104 such that its resistance goes back to the high resistance status. For example, the reverse voltage may break a portion of the conductive filament 109 such that the conductive path formed by the vacancies 108 disappears. Therefore, the resistance of the resistive layer 104 may be adjusted through the application of voltage. The data may be stored in the resistive layer 104. By detecting the current passing through the resistive layer 104, the resistance information of the resistive layer 104 may be obtained. Therefore, the stored data is also obtained.

As mentioned above, after the resistive layer 104 is activated by the forming process to form defects (such as the vacancies 108) therein, the resistance status of the resistive layer 104 is switchable through the application of voltage. However, not all of the memory devices are capable of being successfully activated under the same conditions. In some cases, the memory devices in the same wafer cannot be successfully activated in the same forming process.

Figure 3:
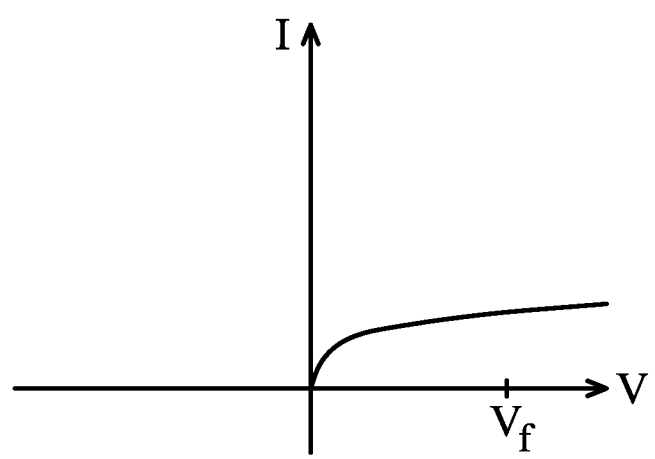
FIG. 3 is an I-V curve obtained from a memory device.

FIG. 3 is an I-V curve obtained from a memory device. As shown in FIG. 3, even if the applied voltage is higher than the predetermined forming voltage $V_f$, the current passing through the resistive layer is still not increased significantly. This means that the vacancies do not successfully form the conductive path between the electrodes by the forming process. As a result, the yield of the memory device is lowered. In some cases, there may be a number of memory devices not successfully activated in the forming process.

The reason why the conductive filament cannot be successfully formed is not clear. It may be by reason of the amorphous structure of the resistive layer. During the forming process, the amorphous structure may cause the negatively charged ions (such as oxygen ions and/or nitrogen ions) to be collided when approaching the electrodes. As a result, the vacancies are not easily formed in the resistive layer, and therefore the conductive filament cannot be formed smoothly.

In order to improve the yield of the memory device, embodiments of the disclosure form a crystalline portion in the resistive layer of the memory device. Therefore, the conductive filament may be formed more easily in the resistive layer.

Figure 4:
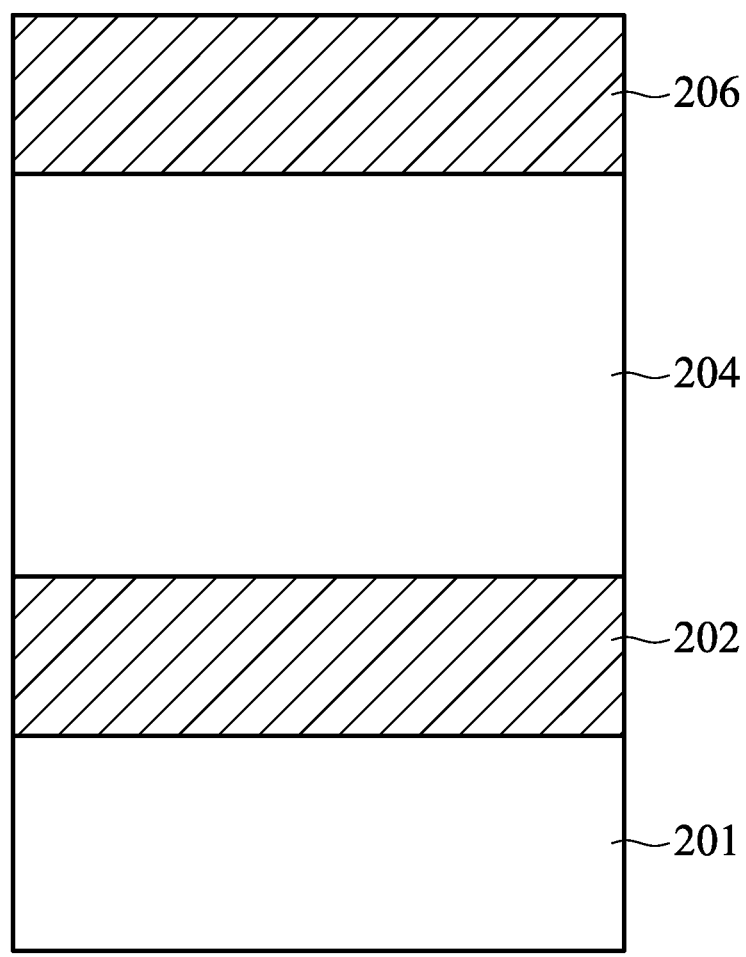
FIG. 4 is a cross-sectional view of a memory device, in accordance with some embodiments.

FIG. 4 is a cross-sectional view of a memory device 200, in accordance with some embodiments. In some embodiments, an electrode 202 is formed over a substrate 201. The substrate 201 may include a semiconductor substrate or other suitable substrate. In some embodiments, the substrate 201 is a semiconductor wafer such as a silicon wafer. In some embodiments, the material of the electrode 202 includes metal nitride. In some embodiments, the material of the electrode 202 includes titanium nitride (TiN), platinum (Pt), aluminum copper (AlCu), titanium (Ti), gold (Au), tantalum (Ta), tantalum nitride (TaN), tungsten (W), tungsten nitride (WN), copper (Cu), other suitable conductive materials, or a combination thereof. In some embodiments, a conductive material is deposited over the substrate 201 to form the electrode 202. For example, a patterning process may be used to pattern the conductive material into the desired electrode. In some embodiments, the conductive material is deposited using a physical vapor deposition process, an electroplating process, a chemical vapor deposition process, a spin coating process, other applicable processes, or a combination thereof.

Afterwards, as shown in FIG. 4, a resistive layer 204 is formed over the electrode 202, in accordance with some embodiments. The material of the resistive layer 204 may include oxide, nitride, other suitable dielectric material, or a combination thereof. For example, the material of the resistive layer 204 includes hafnium oxide, zirconium oxide, titanium oxide, tantalum oxide, tungsten oxide, aluminum oxide, zinc oxide, nickel oxide, copper oxide, other suitable material, or a combination thereof. In some embodiments, a dielectric material is deposited over the electrode 202 to form the resistive layer 204. The dielectric material may be deposited using an atomic layer deposition (ALD) process, a chemical vapor deposition (CVD) process, a physical vapor deposition (PVD) process, a spin coating process, a spraying process, other applicable processes, or a combination thereof. In some embodiments, the deposited dielectric material is patterned such that the resistive layer 204 has a desired pattern.

Figure 5:
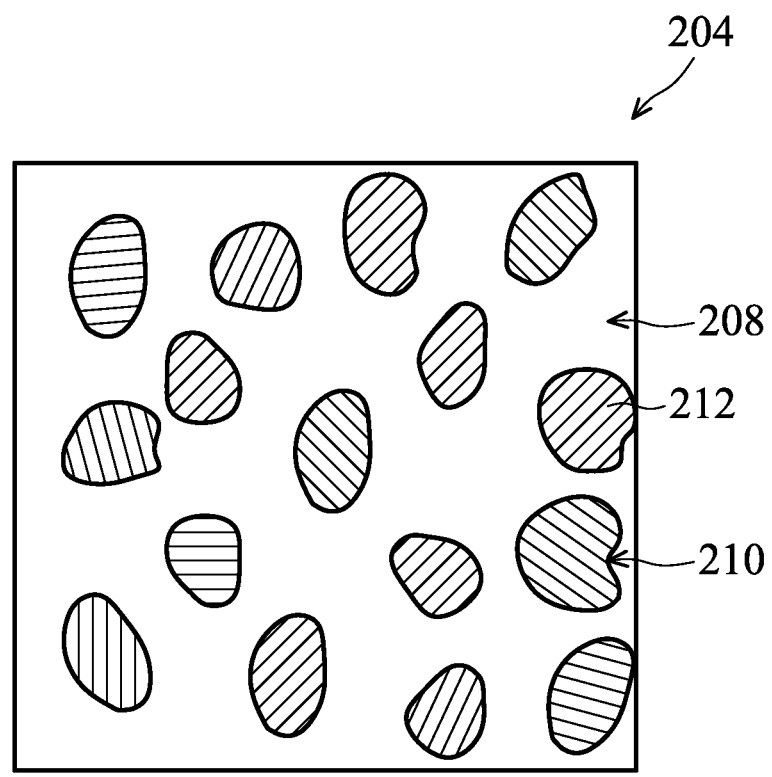
FIG. 5 is a top view showing a microstructure of a resistive layer of a memory device, in accordance with some embodiments.

In some embodiments, the deposited dielectric material is at least partially crystallized such that the resistive layer 204 has a crystalline portion. FIG. 5 is a top view showing a microstructure of a resistive layer of a memory device, in accordance with some embodiments. As shown in FIG. 5, the resistive layer 204 has a crystalline portion 210. In some embodiments, the crystalline portion 210 includes multiple crystalline grains 212. These crystalline grains 212 may be separated from each other, may be connected with each other, or may be partly connected and partly separated. In some embodiments, the resistive layer 204 also has an amorphous portion 208. In some embodiments, these crystalline grains 212 are surrounded by the amorphous portion 208. In some embodiments, a volume ratio of the crystalline portion 210 to the resistive layer 204 is in a range from about 0.2 to about 1. In accordance with some embodiments, in a transmission electron microscopic (TEM) picture, an area ratio of the crystalline portion 210 to the resistive layer 204 is in a range from about 0.2 to about 1. In some embodiments, a volume ratio of the crystalline portion 210 to the resistive layer 204 is in a range from about 0.4 to about 0.8. In accordance with some embodiments, in a TEM picture, an area ratio of the crystalline portion 210 to the resistive layer 204 is in a range from about 0.4 to about 0.8. In some embodiments, the resistive layer 204 is crystallized completely so as to have substantially no amorphous portion.

In some embodiments, the material of the resistive layer 204 includes hafnium oxide. In some embodiments, the material of the resistive layer 204 is $HfO_x$, wherein x is in a range from about 0.2 to about 1.8. In some embodiments, the material of the resistive layer 204 includes aluminum oxide ($Al_2O_3$) or zirconium oxide ($ZrO_2$). In some embodiments, the crystalline grains 212 have a crystalline phase of (but not limited to) monoclinic phase. In some embodiments, an average size of the crystalline grains 212 is in a range from about 2 nm to about 50 nm. In some other embodiments, the average size of the crystalline grains 212 is in a range from about 10 nm to about 40 nm.

A variety of suitable methods may be used to make the resistive layer 204 include the crystalline portion 210. In some embodiments, during the deposition of the dielectric material for forming the resistive later 204, the deposition temperature is set in a range from about 325 degrees C. to about 450 degrees C. As a result, the resistive layer 204 formed may have a microstructure similar to that illustrated in the embodiments shown in FIG. 5. In these cases, the crystalline portion 210 of the resistive layer 204 is formed simultaneously with the deposition of the resistive layer 204. In some embodiments, the deposition temperature of the resistive layer 204 is in a range from about 350 degrees C. to about 400 degrees C. In some other embodiments, the crystalline portion 210 of the resistive layer 204 is formed through an additional crystallization process after the deposition of the resistive layer 204. For example, after the deposition of the resistive layer 204, a heating process may be used to at least partially crystalize the resistive layer 204.

Embodiments of the disclosure have many variations. For example, the crystallization of the resistive layer 204 is not limited to using the heating process. In some embodiments, radiation (such as ultraviolet light, infrared light, and/or laser light) is used to at least partially crystalize the resistive layer 204.

Afterwards, as shown in FIG. 4, an electrode 206 is formed over the resistive layer 204, in accordance with some embodiments. The material of the electrode 206 includes metal nitride. In some embodiments, the material of the electrode 206 includes titanium nitride (TiN), platinum (Pt), aluminum copper (AlCu), titanium (Ti), gold (Au), tantalum (Ta), tantalum nitride (TaN), tungsten (W), tungsten nitride (WN), copper (Cu), other suitable conductive materials, or a combination thereof. In some embodiments, a conductive material is deposited over the resistive layer 204 to form the electrode 206. For example, a patterning process may be used to pattern the conductive material into the desired electrode. In some embodiments, the conductive material is deposited using a physical vapor deposition process, an electroplating process, a chemical vapor deposition process, a spin coating process, other applicable processes, or a combination thereof.

Embodiments of the disclosure have many variations. For example, other material layers (such as a buffer layer and/or a barrier layer) may be formed between the electrode and the resistive layer.

In some embodiments, because the crystalline portion of the resistive layer 204 has a volume ratio of over about 0.2, vacancies are formed more easily in the resistive layer 204, which assists in the formation of conductive filaments. Therefore, the yield of memory device may be further improved.

Although the embodiments and their advantages have been described in detail, it should be understood that various changes, substitutions, and alterations can be made herein without departing from the spirit and scope of the embodiments as defined by the appended claims.

What is claimed is:
1. A memory device, comprising:
  a first electrode;
  a second electrode; and
  a resistive layer positioned between the first electrode and the second electrode, wherein the resistive layer has a crystalline portion, and a volume ratio of the crystalline portion to the resistive layer is in a range from about 0.2 to about 1.
2. The memory device as claimed in claim 1, wherein the crystalline portion comprises a plurality of crystalline grains.
3. The memory device as claimed in claim 2, wherein an average grain size of the crystalline grains is in a range from about 2 nm to about 50 nm.
4. The memory device as claimed in claim 1, wherein the resistive layer comprises hafnium oxide.
5. The memory device as claimed in claim 1, wherein the crystalline portion comprises a plurality of crystalline grains, and the crystalline grains have a crystalline phase of monoclinic phase.
6. The memory device as claimed in claim 1, wherein the crystalline portion comprises a plurality of crystalline grains, and the crystalline grains are surrounded by an amorphous portion of the resistive layer.
7. The memory device as claimed in claim 6, wherein the crystalline grains are separated from each other.
8. The memory device as claimed in claim 6, wherein some of the crystalline grains connect with each other.
9. The memory device as claimed in claim 6, wherein some of the crystalline grains are separated from each other.
10. The memory device as claimed in claim 1, wherein the resistive layer comprises aluminum oxide, zirconium oxide, titanium oxide, tantalum oxide, tungsten oxide, zinc oxide, nickel oxide, copper oxide, or a combination thereof.
11. A memory device, comprising:
  a first electrode;
  a second electrode; and
  a resistive layer positioned between the first electrode and the second electrode, wherein the resistive layer has a crystalline portion, and an area ratio of the crystalline portion to the resistive layer is in a range from about 0.2 to about 1.
12. The memory device as claimed in claim 11, wherein the crystalline portion comprises a plurality of crystalline grains.
13. The memory device as claimed in claim 11, wherein an average grain size of the crystalline grains is in a range from about 2 nm to about 50 nm.
14. The memory device as claimed in claim 11, wherein the crystalline portion comprises a plurality of crystalline grains, and the crystalline grains are surrounded by an amorphous portion of the resistive layer.

* * * * *